United States Patent
Zhixiang et al.

(10) Patent No.: US 11,257,881 B2
(45) Date of Patent: Feb. 22, 2022

(54) PIXEL ARRANGEMENT STRUCTURE, VAPOR DEPOSITION MASK AND IRREGULAR-SHAPED DISPLAY SCREEN

(71) Applicants: KUNSHAN NEW FLAT PANEL DISPLAY TECHNOLOGY CENTER CO., LTD, Jiangsu (CN); KUNSHAN GO-VISIONOX OPTO-ELECTRONICS CO., LTD, Jiangsu (CN)

(72) Inventors: Wang Zhixiang, Kunshan (CN); Hu Siming, Kunshan (CN); Zhang Tingting, Kunshan (CN); Zhu Hui, Kunshan (CN)

(73) Assignees: Kunshan New Flat Panel Display Technology Center Co., Ltd., Jiangsu (CN); Kunshan Go-Visionox Opto-Electronics Co., Ltd., Jiangsu (CN)

( * ) Notice: Subject to any disclaimer, the term of this patent is extended or adjusted under 35 U.S.C. 154(b) by 711 days.

(21) Appl. No.: 15/781,350

(22) PCT Filed: Jan. 24, 2017

(86) PCT No.: PCT/CN2017/072400
§ 371 (c)(1),
(2) Date: Jun. 4, 2018

(87) PCT Pub. No.: WO2017/133566
PCT Pub. Date: Aug. 10, 2017

(65) Prior Publication Data
US 2020/0273925 A1    Aug. 27, 2020

(30) Foreign Application Priority Data

Feb. 3, 2016 (CN) .......................... 201610076497.4

(51) Int. Cl.
*H01L 29/04* (2006.01)
*H01L 27/32* (2006.01)
(Continued)

(52) U.S. Cl.
CPC .......... *H01L 27/3246* (2013.01); *C23C 14/04* (2013.01); *H01L 27/3262* (2013.01); *H01L 51/56* (2013.01)

(58) Field of Classification Search
None
See application file for complete search history.

(56) References Cited

U.S. PATENT DOCUMENTS

2006/0077191 A1* 4/2006 Ming-Daw ....... G02F 1/133351
                                                                345/204
2010/0013853 A1  1/2010 Takatori
(Continued)

FOREIGN PATENT DOCUMENTS

CN       1719322 A      1/2006
CN       202583659 U    12/2012
(Continued)

OTHER PUBLICATIONS

Decision of Rejection of Japanese Application No. 2018-535174; dated Oct. 1, 2019; pp. 1-9.
(Continued)

*Primary Examiner* — Hung K Vu
(74) *Attorney, Agent, or Firm* — Taft Stettinius & Hollister LLP; Stephen F. Rost (57) ABSTRACT

The present invention provides a pixel arrangement structure, a vapor deposition mask and an irregular-shaped display screen. The pixel arrangement structure is used for irregular-shaped display of an irregular-shaped display screen, the pixel arrangement structure is provided with several rows and/or several columns of pixel display units,
(Continued)

wherein neighboring rows and/or neighboring columns of the pixel display units are arranged in parallel within an irregular-shaped display region (105). By arranging the pixel display units within the irregular-shaped display region (105) in such a way that the neighboring rows and/or neighboring columns of the pixel display units are parallel rows or columns, a confusion phenomenon at the interface between an irregular-shaped display region (105) and a non-display region (107) on an edge of the irregular-shaped display region (105) can be eliminated.

7 Claims, 6 Drawing Sheets (51) Int. Cl.
*C23C 14/04* (2006.01)
*H01L 51/56* (2006.01)

(56) References Cited

U.S. PATENT DOCUMENTS

| | | | |
|---|---|---|---|
| 2010/0271387 | A1 | 10/2010 | Shen et al. |
| 2011/0256650 | A1 | 10/2011 | Matsueda |
| 2012/0112988 | A1 | 1/2012 | Huang et al. |
| 2013/0264957 | A1 | 10/2013 | Takatori |
| 2014/0117336 | A1 | 5/2014 | Kim et al. |
| 2014/0150721 | A1 | 6/2014 | Oh et al. |
| 2014/0291637 | A1 | 10/2014 | Yim et al. |
| 2015/0027367 | A1 | 1/2015 | Hong |
| 2015/0228702 | A1 | 8/2015 | Lee |
| 2015/0286457 | A1 | 10/2015 | Kim et al. |
| 2015/0364526 | A1 | 12/2015 | Peng et al. |
| 2016/0011504 | A1 | 1/2016 | Wu |
| 2016/0021367 | A1 | 1/2016 | Yoon et al. |

FOREIGN PATENT DOCUMENTS

| | | |
|---|---|---|
| CN | 103855325 A | 6/2014 |
| CN | 103869568 A | 6/2014 |
| CN | 204424258 U | 6/2015 |
| CN | 204803392 U | 11/2015 |
| EP | 2738284 A1 | 6/2014 |
| JP | 2003233330 A | 8/2003 |
| JP | 2011030278 A | 2/2011 |
| JP | 2012103335 A | 5/2012 |
| JP | 2012229484 A | 11/2012 |
| JP | 2015084104 A | 4/2015 |
| KR | 1020120049816 A | 5/2012 |
| KR | 1020140055529 A | 5/2014 |
| KR | 1020140070255 A | 6/2014 |
| TW | M247856 U | 10/2004 |
| TW | I267058 A | 11/2006 |
| TW | 201239492 A | 10/2012 |
| TW | 201430163 A | 8/2014 |

OTHER PUBLICATIONS

Korean First Office Action, dated Nov. 12, 2019; pp. 1-23.
Fourth Office Action of Taiwan Application No. 107136580, dated Feb. 21, 2020; pp. 1-8.
Japanese Office Action, Japan Patent Office, Japanese Patent Application No. 2018-535174, dated May 28, 2019, 6 pages.
European Office Action, European Patent Office, European Patent Application No. 17746886.5, dated May 14, 2019, 6 pages.
Second Office Action of Taiwan application No. 107136580; dated Jun. 19, 2019; pp. 1-4.
Second Office Action of China application No. 2016100764974; dated Jun. 18, 2019; pp. 1-13.
European Search Report, European Patent Office, European Application No. 17746886.5, dated Oct. 24, 2018, pp. 1-10.
Notice of Final Rejection of Korean Application No. 10-2018-7016194, dated May 28, 2020; pp. 1-7.
First Office Action of China application No. 201610076497.4, dated Mar. 14, 2019, pp. 1-7.
Second Examination Report of European applcation No. 17746886.5; dated Nov. 10, 2019; pp. 1-4.
Correspondence from Ministry of Economic Affairs Intellectual Property Office in Taiwan, Taiwan Application 10721216800, 2 pages (original text) and 2 pages (English translation), dated Dec. 26, 2018.

\* cited by examiner

PIXEL ARRANGEMENT STRUCTURE, VAPOR DEPOSITION MASK AND IRREGULAR-SHAPED DISPLAY SCREEN

This application is a U.S. national stage application under 35 U.S.C. § 371 of PCT International Application Serial No. PCT/CN2017/072400, which has an international filing date of Jan. 24, 2017, designates the United States of America, and claims the benefit of CN Application No. 201610076497.4, which was filed on Feb. 3, 2016, the disclosures of which are hereby expressly incorporated by reference in their entirety.

TECHNICAL FIELD

The present invention relates to the field of organic electroluminescence display, and in particular relates to a pixel arrangement structure used for irregular-shaped display, a vapor deposition mask for manufacturing the pixel arrangement structure of irregular-shaped display, and an irregular-shaped display screen.

BACKGROUND

Organic Light-Emitting Display (OLED) devices have the advantages such as active light-emitting, light-and-thin, a wide viewing angle, fast response speed, energy-saving, a large range of temperature tolerance, ability to realize flexible display as well as transparent display, and thus is regarded as the next-generation most potential new flat panel display technology.

With people's various demands increase in the field of display, irregular-shaped display devices are becoming more and more popular. Because the pixel arrangement structure in prior arts is a lattice arrangement, an edge of an irregular-shaped display region would have a stepwise arrangement of pixels that does not have a regular pattern and would usually exceed the display region to a relatively large extent, this causes waste of materials for other layers, and meanwhile it is difficult to narrow the rim portion of the irregular-shaped display screen, which causes confusion at the interface between a display region and a non-display region.

SUMMARY OF THE INVENTION

The present invention provides a pixel arrangement structure for an irregular-shaped display region, wherein, by means of arranging the pixel display units within the irregular-shaped display region in such a way that the neighboring rows and/or neighboring columns of the pixel display units are parallel rows or columns, a confusion phenomenon at the interface between a display region and a non-display region on an edge of the display region is eliminated.

The present invention also provides a vapor deposition mask for manufacturing the pixel arrangement structure of irregular-shaped display, and an irregular-shaped display screen.

In order to solve the above-mentioned technical problem, the present invention is realized by the following technical schemes:

A pixel arrangement structure is used for irregular-shaped display of an irregular-shaped display screen, the pixel arrangement structure is provided with several rows and/or several columns of pixel display units, wherein neighboring rows and/or neighboring columns of the pixel display units are arranged in parallel within an irregular-shaped display region.

The irregular-shaped display is single-point display, line display, area display or a combination thereof.

The single-point display is adapted for being used by a screen having a single-point display region, and one single pixel display unit is provided within the single-point display region.

The line display is adapted for being used by a screen having a single-line display region, and the single-line display region is a straight line display region, an oblique line display region and/or a curved line display region.

The oblique line display region forms an intersection angle of θ with respect to the horizontal plane, the oblique line display region is provided with several rows and/or several columns of pixel display units, wherein neighboring rows and/or neighboring columns of the pixel display units are arranged in parallel, so as to cause a line connecting two pixel display units farthest apart within the oblique line display region to form an intersection angle of θ with respect to the horizontal plane. In accordance with variation of the angle θ, the pixel arrangement structure in the straight line display region or the oblique line display region is as follows:

when θ=90° or 0°, the pixel display units are arranged in a vertical direction or a horizontal direction within the display region;

when θ=30° or 150°, the display region is provided with multiple rows of pixel display unit groups, wherein each pixel display unit group includes 3 pixel display units arranged side-by-side in a horizontal direction, pixel display units at two ends of each pixel display unit group are respectively aligned with a single pixel display unit in a neighboring pixel display unit group; an outermost row at one end of the display region is provided with one single pixel display unit; a line connecting two pixel display units farthest apart within the display region forms an angle of 30° or 150° with the horizontal plane;

when θ=45° or 135°, the display region is provided with multiple rows of pixel display unit groups, wherein each pixel display unit group includes 2 pixel display units arranged side-by-side in a horizontal direction, the 2 pixel display units in each pixel display unit group are respectively aligned with a pixel display unit in a neighboring pixel display unit group; a line connecting two pixel display units farthest apart within the display region forms an angle of 45° or 135° with the horizontal plane;

when θ=60° or 120°, the display region is provided with multiple columns of pixel display unit groups, wherein each pixel display unit group includes 3 pixel display units arranged side-by-side in a vertical direction, pixel display units at two ends of each pixel display unit group are respectively aligned with a single pixel display unit in a neighboring pixel display unit group; an outermost column at two ends of the display region is provided with one single pixel display unit; a line connecting two pixel display units farthest apart within the display region forms an angle of 60° or 120° with the horizontal plane;

when 45°<θ<60°, pixel display units having an arrangement like that of θ=60° account for (60-θ)/(60-45) of the oblique line, and pixel display units having an arrangement like that of θ=45° account for (θ-45)/(60-45) of the oblique line; the display region has a length of L, one pixel display unit has a length of L0, and the display region is provided with S1 pixel display units arranged in a horizontal direction and S2 pixel display units arranged in a vertical direction:

$$S_1 = \left[2 \times \frac{60-\theta}{60-45} + 2 \times \frac{\theta-45}{60-45}\right] \times \left(\frac{L}{2}\right)^{\frac{1}{2}} \times L_0$$

$$S_2 = \left[3 \times \frac{60-\theta}{60-45} + 2 \times \frac{\theta-45}{60-45}\right] \times \left(\frac{L}{2}\right)^{\frac{1}{2}} \times L_0;$$

when 60°<θ<90°, pixel display units having an arrangement like that of θ=90° account for (90-θ)/(90-60) of the oblique line, and pixel display units having an arrangement like that of θ=60° account for (θ-60)/(90-60) of the oblique line; the display region has a length of L, one pixel display unit has a length of L0, and the display region is provided with S3 pixel display units arranged in a horizontal direction and S4 pixel display units arranged in a vertical direction:

$$S_3 = \left[2 \times \frac{90-\theta}{90-60} + 2 \times \frac{\theta-60}{90-60}\right] \times \left(\frac{L}{2}\right)^{\frac{1}{2}} \times L_0$$

$$S_4 = \left[3 \times \frac{90-\theta}{90-60} + 2 \times \frac{\theta-60}{90-60}\right] \times \left(\frac{L}{2}\right)^{\frac{1}{2}} \times L_0.$$

When the display region is a curved line display region, the curved line display region is decomposed into small oblique line segments having different angles, wherein each oblique line segment is provided with 2 to 3 pixel display units,
several rows and/or several columns of pixel display units are provided within the oblique line segment, wherein neighboring rows and/or neighboring columns of the pixel display units are arranged in parallel, so as to cause a line connecting two pixel display units farthest apart within the oblique line segment to form an angle of θ with respect to the horizontal plane.

The area display is adapted for being used by a screen having an area display region, and when pixels are arranged, the area display region is decomposed into oblique line display regions having different angles and a border line display region,
each of the oblique line display regions is provided with several rows and/or several columns of pixel display units, wherein neighboring rows and/or neighboring columns of the pixel display units are arranged in parallel, so as to cause a line connecting two pixel display units farthest apart within the oblique line display region to form an angle, with the horizontal plane, equal to the intersection angle between the oblique line and the horizontal plane;
the border line display region is decomposed into small oblique line segment display regions having different angles, wherein each oblique line segment display region is provided with 2 to 3 pixel display units; several rows and/or several columns of pixel display units are provided within the oblique line segment display region, wherein neighboring rows and/or neighboring columns of the pixel display units are arranged in parallel, so as to cause a line connecting two pixel display units farthest apart within the oblique line segment display region to form an angle, with the horizontal plane, equal to the intersection angle between the oblique line segment and the horizontal plane.

The pixel display units comprise one or more selected from a red light sub-pixel, a green light sub-pixel, a blue light sub-pixel.

An irregular-shaped display screen, comprising a substrate and a TFT driving layer provided upon the substrate, the substrate is divided into an irregular-shaped display region and a non-display region, a plurality of pixel defining layers are provided upon the TFT driving layer, the pixel defining layers form a continuous network structure, wherein, the pixel defining layer upon the irregular-shaped display region has an open structure, the pixel defining layer upon the non-display region has a non-open state, the irregular-shaped display region is provided with the above-mentioned pixel arrangement structure.

A vapor deposition mask for manufacturing an irregular-shaped display screen, comprising a plurality of mask strips arranged in parallel, a mask frame and a mask shield arranged in sequence outside the mask strips, wherein the mask strips comprises a plurality of open window zones, wherein, the open window zone is provided with a full-etching open area and a semi-etching open area, and the full-etching open area has a shape that fits a pixel arrangement structure of the irregular-shaped display region.

A manufacturing method of the irregular-shaped display screen, comprising the following steps: providing a TFT driving layer upon a substrate; coating an organic photoresist layer upon the TFT driving layer; exposing and developing the organic photoresist layer within an irregular-shaped display region, so as to form a pixel defining layer having an open structure, wherein the open-structured pixel defining layer has an arrangement structure that corresponds to a pixel arrangement structure within the irregular-shaped display region; and depositing pixel display units within the open-structured pixel defining layer by using the above-mentioned vapor deposition mask.

The full-etching open area of the vapor deposition mask has a shape that fits the pixel arrangement structure of the irregular-shaped display region.

As compared to the prior art, the above-mentioned technical schemes of the present invention have the following advantages:

(1) In the pixel arrangement structure used for irregular-shaped display provided by the present invention, several rows and/or several columns of pixel display units are provided within an irregular-shaped display region, wherein neighboring rows and/or neighboring columns of the pixel display units are arranged in parallel within the irregular-shaped display region. Different pixel display unit arrangement structures are used in accordance with different irregular-shaped display regions, so that the irregular-shaped display region can be controlled most precisely, especially for the edge of the irregular-shaped display region, thereby making the edge of the irregular-shaped display region smooth and clear. In the meantime, it is beneficial for the design of subsequent film layers and would not cause waste of materials.

(2) When the irregular-shaped display region is a single-point display region, a line display region, an area display region or a combination thereof, the pixel display unit arrangement structures are respectively as follows:
① when the irregular-shaped display region is a single-point display region: the pixel defining layer upon the single-point display region has an open structure, the pixel defining layer upon the non-display region has a non-open state, and the open-structured pixel defining layer has one single pixel display unit arranged therein.
② when the irregular-shaped display region is a straight line or oblique line display region: the pixel defining layer upon the line display region has an open structure, the pixel defining layer upon the non-display region has a non-open state, and the open-structured pixel defining layer has several rows and/or several columns of pixel display units arranged therein, wherein neighboring rows and/or neighboring columns of the pixel display units are arranged in parallel, so as to cause a line connecting two pixel display units farthest apart within the oblique line display region to form an intersection angle of θ with respect to the horizontal plane. With different angles θ, such as 30°, 45° and 60°, the arrangements of pixel display units are also different. Because the arrangement of pixel display units is adjusted according to the variation of the angle of the oblique line, the problem of confused interface on an edge of the irregular-shaped display region can be prevented to the greatest extent possible.

③ when the irregular-shaped display region is a curved line display region: the curved line display region is decomposed into small oblique line segments having different angles, wherein each oblique line segment is provided with 2 to 3 pixel display units; according to different angles of each oblique line segment, the pixel display units are arranged in accordance with the rule of the pixel arrangement structure for the oblique line segments.

④ when the irregular-shaped display region is an area display region: the area display region is decomposed into oblique line display regions having different angles and a border line display region; according to different angles of each oblique line display region, the pixel display units are arranged in accordance with the rule of the pixel arrangement structure for the oblique line display regions; and the border line display region is further decomposed into small oblique line segment display regions having different angles, wherein each oblique line segment display region is provided with 2 to 3 pixel display units; according to different angles of each oblique line segment, the pixel display units are arranged in accordance with the rule of the pixel arrangement structure for the oblique line segments.

(3) The pixel defining layers of the irregular-shaped display screen of the present invention vary according to different distribution regions, wherein the pixel defining layer upon the irregular-shaped display region has an open structure, and the pixel defining layer upon the non-display region has a non-open state. In this way, positioning of the display region can be realized, and meanwhile the materials can be saved.

BRIEF DESCRIPTION OF THE DRAWINGS

In order to make the content of the present invention easier to be understood clearly, hereinafter, the present invention is further described in detail with reference to the accompanying drawings, wherein.

FIG. 2-1 and FIG. 2-2 are structural schematic diagrams of a pixel arrangement structure for a single-point irregular-shaped display region;

FIG. 3-1 and FIG. 3-2 are structural schematic diagrams of a pixel arrangement structure for a line irregular-shaped display region;

FIG. 4-1 and FIG. 4-2 are structural schematic diagrams of a pixel arrangement structure for an area irregular-shaped display region;

FIG. 5-1 and FIG. 5-2 are schematic diagrams of another embodiment of a pixel arrangement structure for an area irregular-shaped display region;

FIG. 6-1 to FIG. 6-5 are schematic diagrams of pixel display unit arrangement structures;

The reference numerals in the Drawings represent: 101-substrate, 102-TFT driving layer, 103-pixel defining layer, 104-encapsulation layer, 105-irregular-shaped display region, 106-pixel display unit, 107-non-display region, 120-mask shield, 121-mask frame, 123-mask strip, 124-open window zone, 125-semi-etching open area, 126-full-etching open area.

DETAILED DESCRIPTION OF EMBODIMENTS

In order to make the objective, technical scheme and advantages of the present invention clearer, detailed description of embodiments of the present invention is further given below, with reference to the accompanying drawings.

The present invention can be implemented in many different forms and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is only defined by the Claims. In the accompanying drawings, for the sake of clarity, dimensions and relative sizes of layers and areas might be exaggerated. It should be understood that, when one element such as a layer, an area or a substrate plate is described as "formed on" or "configured on" another element, this one element may be configured directly upon that another element, or there may exist intermediate element(s). On the contrary, when one element is described as "directly formed upon" or "directly configured upon" another element, there exist no intermediate element.

Figure 1:
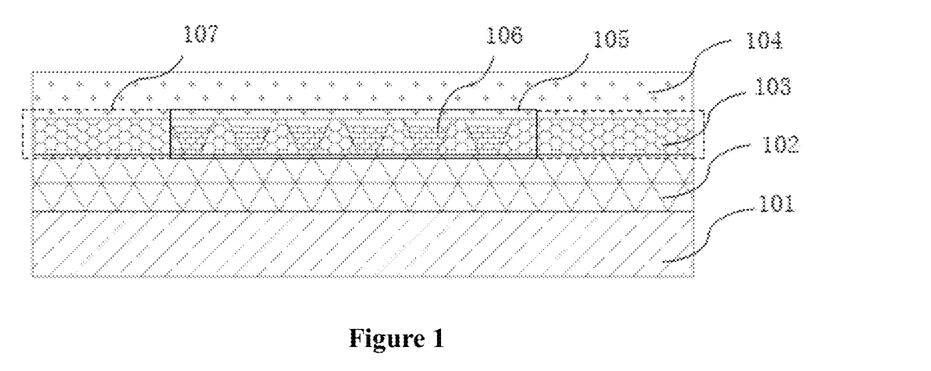
FIG. 1 is a structural schematic diagram of a pixel arrangement structure for an irregular-shaped display region according to the present invention.
Figure 7:
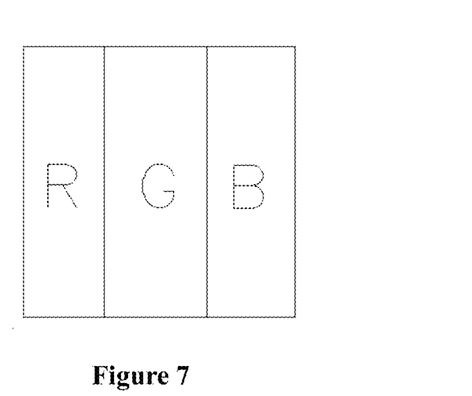
FIG. 7 is a schematic diagram of a pixel display unit.
Figure 8:
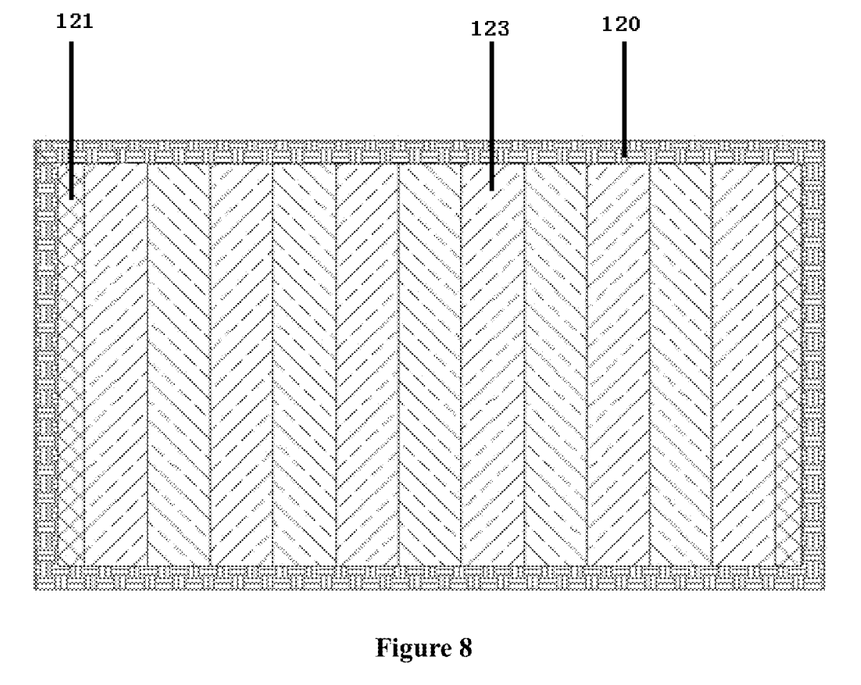
FIG. 8 is a schematic diagram of a vapor deposition mask.
Figure 9:
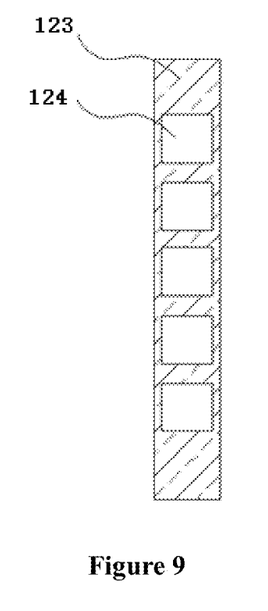
FIG. 9 is a detailed view of a mask strip.
Figure 10:
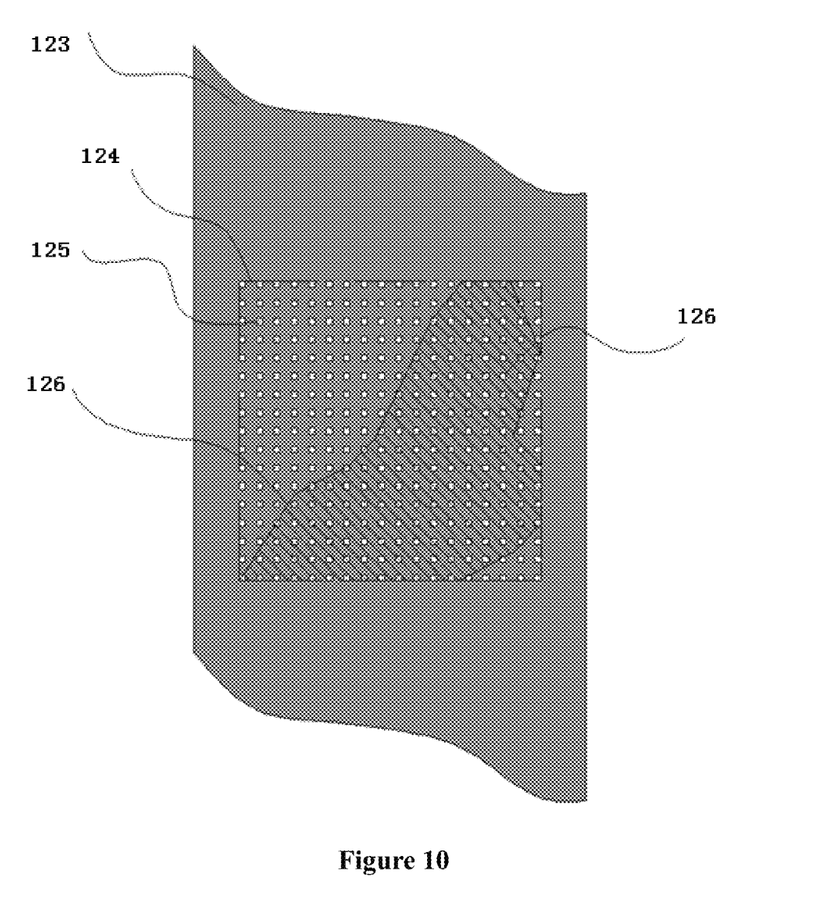
FIG. 10 is a structural schematic diagram of an open window zone.

As shown in FIG. 1 to FIG. 7, the present invention provides a pixel arrangement structure, used for irregular-shaped display, and an irregular-shaped display screen having this pixel arrangement structure. The irregular-shaped display screen, as shown in FIG. 1, comprises a substrate 101 and an encapsulation layer 104, wherein the substrate 101 and the encapsulation layer 104 encapsulate a confined space, the substrate 101 is divided into an irregular-shaped display region 105 and a non-display region 107, the substrate 101 has a TFT driving layer 102 and a plurality of pixel defining layers 103 stacked in sequence thereon, the pixel defining layers 103 form a continuous network structure, the pixel defining layer 103 upon the irregular-shaped display region 105 has an open structure, the pixel defining layer 103 upon the non-display region 107 has a non-open state, the pixel defining layer 103 upon the irregular-shaped display region 105 has several rows and/or several columns of pixel display units 106 arranged therein, the pixel display units 106 within the irregular-shaped display region 106 are arranged in such a way that the neighboring rows and/or neighboring columns of the pixel display units 106 are parallel rows or columns, the pixel display units 106 include one or more of a red light subpixel, a green light subpixel and a blue light subpixel. The irregular-shaped display region 105 is a single-point display region, a line display region, an area display region or a combination thereof, As shown in FIG. 8 to FIG. 10, the present invention also provides a vapor deposition mask for manufacturing the irregular-shaped display screen, comprising a plurality of mask strips 123 arranged in parallel, a mask frame 121 and a mask shield 120 arranged in sequence outside the mask strips 123, the mask strips 123 comprises a plurality of open window zones 124, wherein the open window zone 124 is provided with a full-etching open area 126 and a semi-etching open area 125, the full-etching open area 126 has a shape that fits a pixel arrangement structure of the irregular-shaped display region 105, the semi-etching open area 125 is for alleviating the stress endured by the mask strip and thus preventing the open pore of the full-etching open area 126 from deforming. According to the shape of the above-mentioned irregular-shaped display region 105, the shape of the full-etching open area 126 is adjusted in a corresponding way, wherein the vapor deposition mask of FIGS. 8-10 is suitable for manufacturing an irregular-shaped display screen of area display.

The manufacturing method of the irregular-shaped display screen comprises the following steps: providing a TFT driving layer 102 upon a substrate 101; coating an organic photoresist layer upon the TFT driving layer 102; exposing and developing the organic photoresist layer within an irregular-shaped display region 105, so as to form a pixel defining layer 103 having an open structure, wherein the open-structured pixel defining layer 103 has an arrangement structure that corresponds to a pixel arrangement structure within the irregular-shaped display region 105; and depositing pixel display units 106 within the open-structured pixel defining layer 103 by using the vapor deposition mask. The full-etching open area 126 of the vapor deposition mask has a shape that fits the pixel arrangement structure of the irregular-shaped display region 105.

In accordance with different irregular-shaped display regions 105, the following embodiments are illustrated:

Embodiment 1—Irregular-Shaped Display Screen of Single-Point Display

Figure 21:
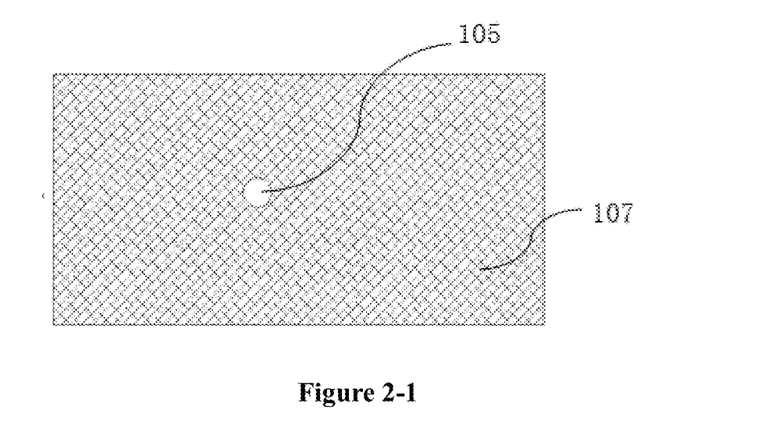
Figure 22:
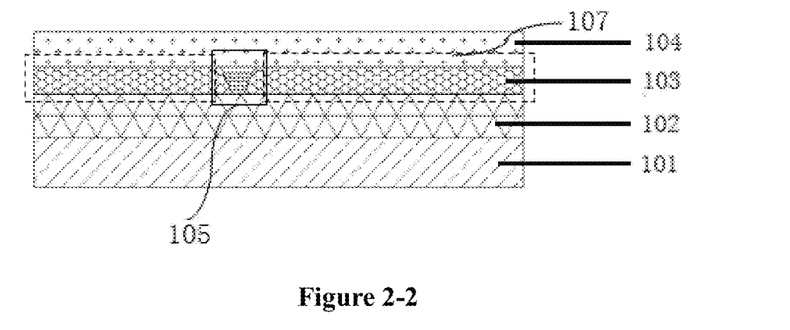

The irregular-shaped display screen of this embodiment, as shown in FIG. 2-1 and FIG. 2-2, comprises a substrate 101 and an encapsulation layer 104, wherein the substrate 101 and the encapsulation layer 104 encapsulate a confined space, the substrate 101 is divided into an irregular-shaped display region 105 and a non-display region 107, the substrate 101 has a TFT driving layer 102 and a plurality of pixel defining layers 103 stacked in sequence thereon, the pixel defining layers 103 form a continuous network structure, the pixel defining layer 103 upon the irregular-shaped display region 105 has an open structure, the pixel defining layer 103 upon the non-display region 107 has a non-open state, the irregular-shaped display region 105 is a single-point display region, the pixel defining layers 103 has one single pixel display unit 106 arranged therein. According to actual requirements, multiple single-point display regions may be arranged on the same screen, wherein each open-structured pixel defining layer 103 has one single pixel display unit 106 arranged therein.

The manufacturing method of the irregular-shaped display screen of single-point display in this embodiment comprises the following steps:
providing a TFT driving layer 102 upon a substrate 101; coating an organic photoresist layer upon the TFT driving layer 102; exposing and developing the organic photoresist layer within a single-point irregular-shaped display region, so as to form a pixel defining layer 103 having an open structure, while the photoresist layer within a non-display region 107 is not exposed, so that a non-open-structured pixel defining layer is formed, wherein the open-structured pixel defining layer has an arrangement structure that corresponds to a pixel arrangement structure within the single-point irregular-shaped display region; and depositing pixel display units 106 within the open-structured pixel defining layer 103 by using the vapor deposition mask. The full-etching open area 126 of the vapor deposition mask has a shape that fits the pixel arrangement structure of the single-point irregular-shaped display region.

Embodiment 2—Irregular-Shaped Display Screen of Straight Line Display

Figure 61:
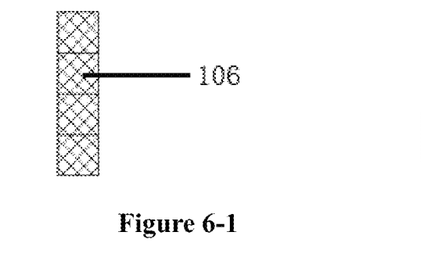
Figure 62:
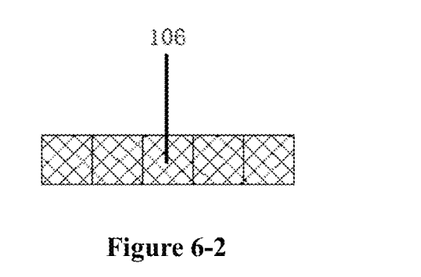

The irregular-shaped display screen of this embodiment has the same screen structure as Embodiment 1, except that the irregular-shaped display region 105 is a horizontal straight line or a vertical straight line. The pixel arrangement structure within the irregular-shaped display region 105 is shown in FIG. 6-1 and FIG. 6-2, wherein the pixel display units 106 are arranged in a horizontal direction or a vertical direction within the display region.

The manufacturing method of the irregular-shaped display screen of straight line display in this embodiment comprises the following steps:
providing a TFT driving layer 102 upon a substrate 101; coating an organic photoresist layer upon the TFT driving layer 102; exposing and developing the organic photoresist layer within a straight line irregular-shaped display region, so as to form a pixel defining layer 103 having an open structure, while the photoresist layer within a non-display region 107 is not exposed, so that a non-open-structured pixel defining layer is formed, wherein the open-structured pixel defining layer has an arrangement structure that corresponds to a pixel arrangement structure within the straight line irregular-shaped display region; and depositing pixel display units 106 within the open-structured pixel defining layer 103 by using the vapor deposition mask. The full-etching open area 126 of the vapor deposition mask has a shape that fits the pixel arrangement structure of the straight line irregular-shaped display region.

Embodiment 3—Irregular-Shaped Display Screen of Oblique Line Display

The irregular-shaped display screen of this embodiment has the same screen structure as Embodiment 1, except that the irregular-shaped display region 105 is an oblique line display region. The oblique line may form an acute angle or an obtuse angle with the horizontal plane. Considering that oblique lines with an acute angle and an obtuse angle (such as 30° and 150°, 45° and 135°, 60° and 120°) are mirrored towards a vertical axis, this embodiment only illustrate the situations of acute angles, and the arrangements of the oblique line display regions with corresponding obtuse angles can be obtained by mirroring the situations illustrated in this embodiment.

Figure 63:
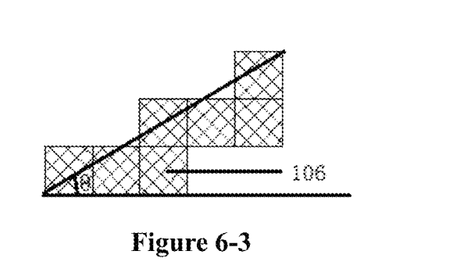

The oblique line display region of this embodiment forms an intersection angle of $\theta$ with respect to the horizontal plane, the oblique line display region is provided with several rows and/or several columns of pixel display units 106, wherein neighboring rows and/or neighboring columns of the pixel display units 106 are arranged in parallel, so as to cause a line connecting two pixel display units 106 farthest apart within the display region to form an intersection angle of $\theta$ with respect to the horizontal plane. In particular:

When $\theta=30°$, the display region is provided with multiple rows of pixel display unit groups, as shown in FIG. 6-3, each pixel display unit group includes 3 pixel display units arranged side-by-side in a horizontal direction, pixel display units at two ends of each pixel display unit group are respectively aligned with a single pixel display unit in a neighboring pixel display unit group; an outermost row at one end of the display region is provided with one single pixel display unit; a line connecting two pixel display units farthest apart within the display region forms an angle of 30° with the horizontal plane. Specifically, as viewed from a direction facing the drawing plane of FIG. 6-3, from downside to upside in the display region, the first row and the second row of pixel display unit groups respectively have three pixel display units arranged side-by-side in a horizontal direction, the rightmost pixel display unit in the first row is positioned in the same column with the leftmost pixel display unit in the second row; the third row has one single pixel display unit which is positioned in the same column with the rightmost pixel display unit in the second row; and so on. If the length of the oblique line display region is longer than what is shown in this figure, the pixel arrangement structure of the first row and the second row can be repeated.

Figure 64:
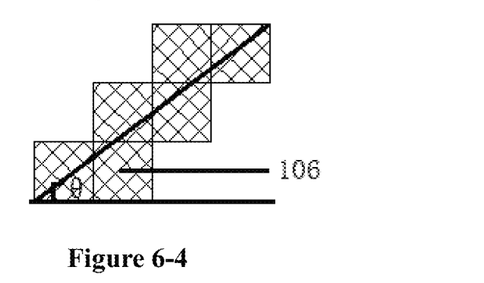
Figure 65:
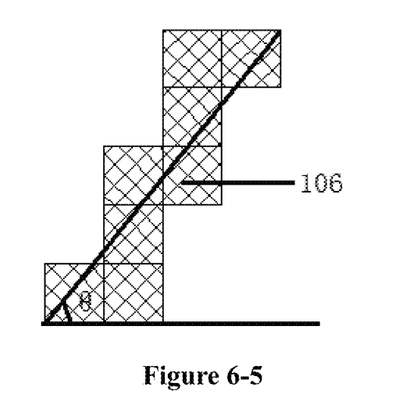

When $\theta=45°$, the display region is provided with multiple rows of pixel display unit groups, wherein each pixel display unit group includes 2 pixel display units arranged side-by-side in a horizontal direction, the 2 pixel display units in each pixel display unit group are respectively aligned with a pixel display unit in a neighboring pixel display unit group; a line connecting two pixel display units farthest apart within the display region forms an angle of 45° with the horizontal plane. Specifically, as viewed from a direction facing the drawing plane of FIG. 6-4, from downside to upside in the display region, the first row, the second row and the third row of pixel display unit groups respectively have two pixel display units arranged side-by-side in a horizontal direction, the rightmost pixel display unit in the first row is positioned in the same column with the leftmost pixel display unit in the second row, the rightmost pixel display unit in the second row is positioned in the same column with the leftmost pixel display unit in the third row; and so on. If the length of the oblique line display region is longer than what is shown in this figure, the pixel arrangement structure of the first row and the second row can be repeated.

When $\theta=60°$, the display region is provided with multiple columns of pixel display unit groups, wherein each pixel display unit group includes 3 pixel display units arranged side-by-side in a vertical direction, pixel display units at two ends of each pixel display unit group are respectively aligned with a single pixel display unit in a neighboring pixel display unit group; an outermost column at two ends of the display region is provided with one single pixel display unit; a line connecting two pixel display units farthest apart within the display region forms an angle of 60° with the horizontal plane. Specifically, as viewed from a direction facing the drawing plane of FIG. 6-4, from left to right in the display region, the second column and the third column of pixel display unit groups respectively have two pixel display units arranged side-by-side in a vertical direction, the uppermost pixel display unit in the first column is positioned in the same row with the lowermost pixel display unit in the second column, the first column has one single pixel display unit which is positioned in the same row with the lowermost pixel display unit in the second column, the fourth column has one single pixel display unit which is positioned in the same row with the uppermost pixel display unit in the third column; and so on. If the length of the oblique line display region is longer than what is shown in this figure, the pixel arrangement structure of the second column and the third column can be repeated.

When $45°<\theta<60°$, pixel display units having an arrangement like that of $\theta=60°$ account for $(60-\theta)/(60-45)$ of the oblique line, and pixel display units having an arrangement like that of $\theta=45°$ account for $(\theta-45)/(60-45)$ of the oblique line. Specifically, when $\theta=50°$, pixel display units having an arrangement like that of $\theta=60°$ account for $(60-50)/(60-45)=10/15=2/3$ of the oblique line, and pixel display units having an arrangement like that of $\theta=45°$ account for $(50-45)/(60-45)=5/15=1/3$ of the oblique line. That is to say, within this oblique line display region, $2/3$ of the pixel arrangement structure is arranged in accordance with the rule of the 60° angle oblique line pixel arrangement, $1/3$ of the pixel arrangement structure is arranged in accordance with the rule of the 45° angle oblique line pixel arrangement, and a line connecting two pixel display units farthest apart within this display region forms an intersection angle of 50° with the horizontal plane. The display region has a length of L, one pixel display unit has a length of L0, and the display region is provided with S1 pixel display units arranged in a horizontal direction and S2 pixel display units arranged in a vertical direction:

$$S_1 = \left[2 \times \frac{60-\theta}{60-45} + 2 \times \frac{\theta-45}{60-45}\right] \times \left(\frac{L}{2}\right)^{\frac{1}{2}} \times L_0$$

$$S_2 = \left[3 \times \frac{60-\theta}{60-45} + 2 \times \frac{\theta-45}{60-45}\right] \times \left(\frac{L}{2}\right)^{\frac{1}{2}} \times L_0;$$

When $60°<\theta<90°$, pixel display units having an arrangement like that of $\theta=90°$ account for $(90-\theta)/(90-60)$ of the oblique line, and pixel display units having an arrangement like that of $\theta=60°$ account for $(\theta-60)/(90-60)$ of the oblique line; the display region has a length of L, one pixel display unit has a length of L0, and the display region is provided with S3 pixel display units arranged in a horizontal direction and S4 pixel display units arranged in a vertical direction:

$$S_3 = \left[2 \times \frac{90-\theta}{90-60} + 2 \times \frac{\theta-60}{90-60}\right] \times \left(\frac{L}{2}\right)^{\frac{1}{2}} \times L_0$$

$$S_4 = \left[3 \times \frac{90-\theta}{90-60} + 2 \times \frac{\theta-60}{90-60}\right] \times \left(\frac{L}{2}\right)^{\frac{1}{2}} \times L_0.$$

Embodiment 4—Curved Line Display Region

Figure 31:
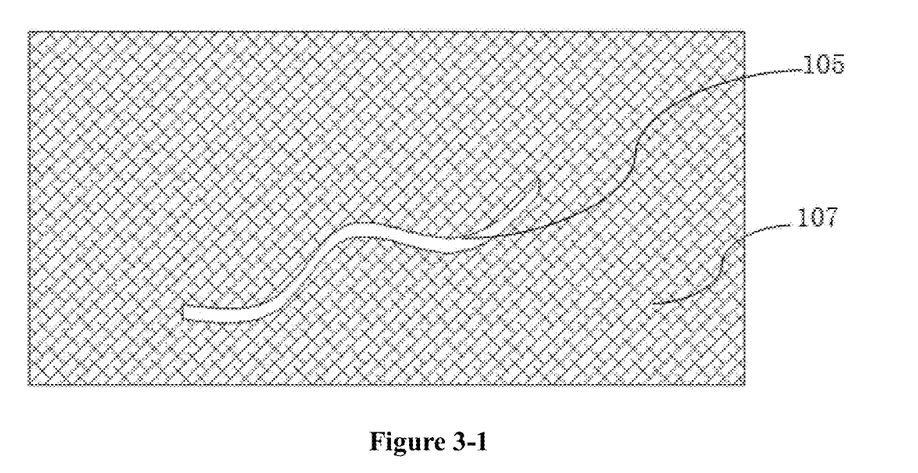
Figure 32:
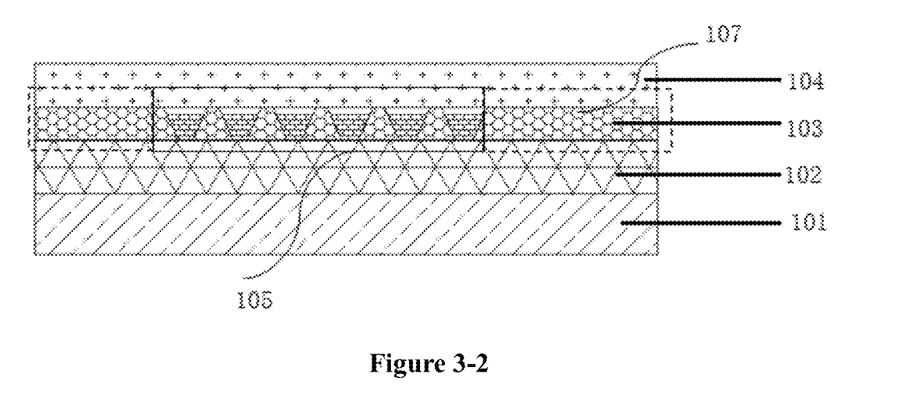
Figure 41:
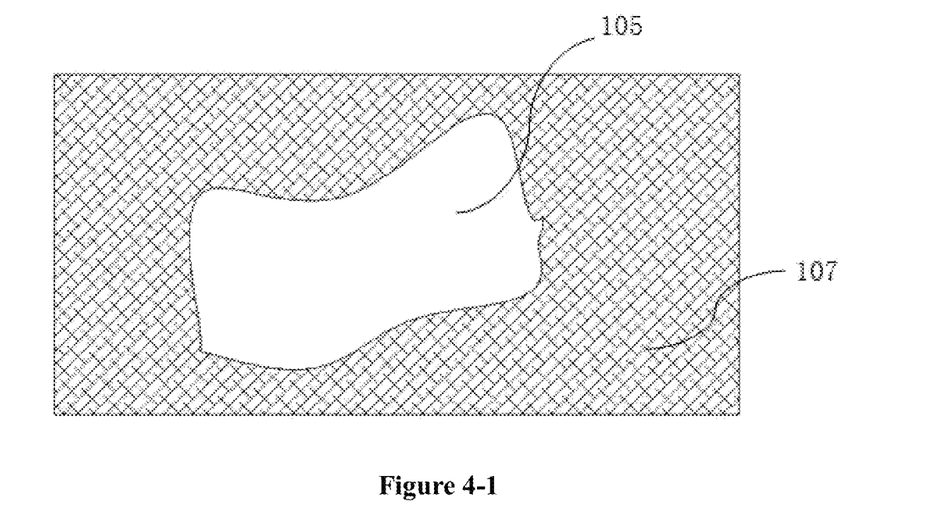
Figure 42:
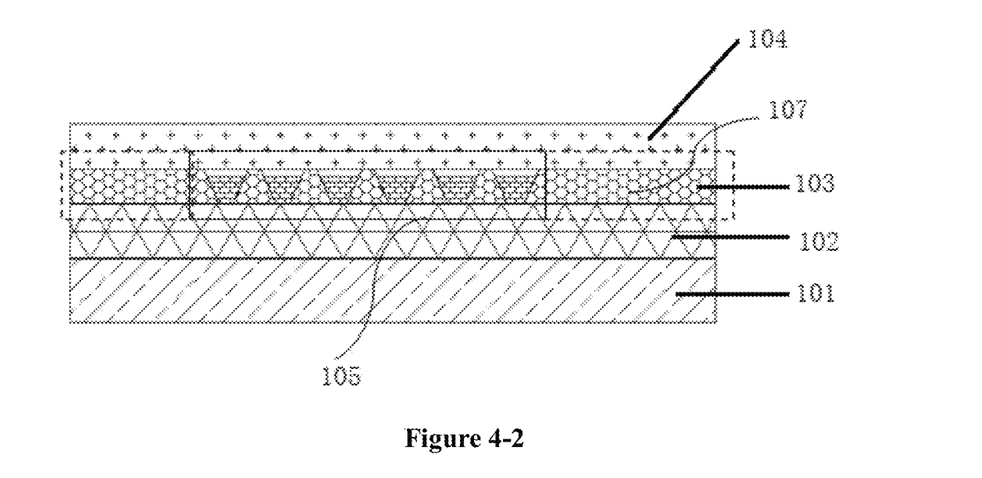

The irregular-shaped display screen of this embodiment has the same screen structure as Embodiment 1, except that the irregular-shaped display region 105 is a curved line display region as shown in FIG. 3-1 and FIG. 3-2. the curved line display region is decomposed into small oblique line segments having different angles, wherein each oblique line segment is provided with 2 to 3 pixel display units 106; several rows and/or several columns of pixel display units are provided within the oblique line segment, wherein neighboring rows and/or neighboring columns of the pixel display units are arranged in parallel, so as to cause a line connecting two pixel display units farthest apart within the oblique line segment to form an angle of $\theta$ with respect to the horizontal plane. According to different angles that each oblique line segment forms with the horizontal plane, the pixel display units 106 are arranged in accordance with the manner described in Embodiment 3.

The manufacturing method of the irregular-shaped display screen of curved line display in this embodiment comprises the following steps:

providing a TFT driving layer 102 upon a substrate 101; coating an organic photoresist layer upon the TFT driving layer 102; exposing and developing the organic photoresist layer within a curved line irregular-shaped display region, so as to form a pixel defining layer 103 having an open structure, while the photoresist layer within a non-display region 107 is not exposed, so that a non-open-structured pixel defining layer is formed, wherein the open-structured pixel defining layer has an arrangement structure that corresponds to a pixel arrangement structure within the curved line irregular-shaped display region; and depositing pixel display units 106 within the open-structured pixel defining layer by using the vapor deposition mask. The full-etching open area 126 of the vapor deposition mask has a shape that fits the pixel arrangement structure of the curved line irregular-shaped display region.

Embodiment 5—Irregular-Shaped Display Screen of Area Display

Figure 51:
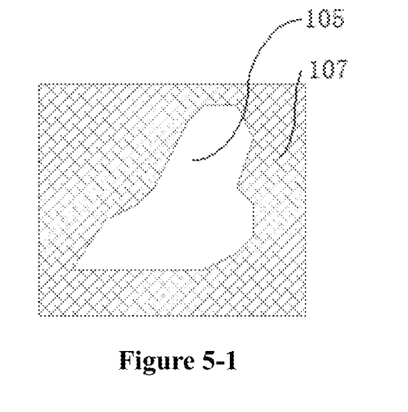
Figure 52:
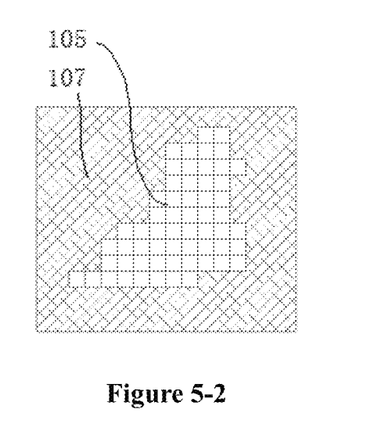

The irregular-shaped display screen of this embodiment has the same screen structure as Embodiment 1, except that the irregular-shaped display region 105 is an area display region as shown in FIG. 5-1 and FIG. 5-2. The area display region is decomposed into oblique line display regions having different angles and a border line display region.

Each of the oblique line display regions is provided with several rows and/or several columns of pixel display units 106, wherein neighboring rows and/or neighboring columns of the pixel display units 106 are arranged in parallel, so as to cause a line connecting two pixel display units farthest apart within the oblique line display region to form an angle, with the horizontal plane, equal to the intersection angle between the oblique line and the horizontal plane. Specifically, according to different angles that each oblique line forms with the horizontal plane, the pixel display units 106 are arranged in accordance with the manner described in Embodiment 3.

The border line display region is decomposed into small oblique line segment display regions having different angles, wherein each oblique line segment display region is provided with 2 to 3 pixel display units 106; several rows and/or several columns of pixel display units 106 are provided within the oblique line segment display region, wherein neighboring rows and/or neighboring columns of the pixel display units 106 are arranged in parallel, so as to cause a line connecting two pixel display units 106 farthest apart within the oblique line segment display region to form an angle, with the horizontal plane, equal to the intersection angle between the oblique line segment and the horizontal plane. Specifically, according to different angles that each oblique line segment forms with the horizontal plane, the pixel display units 106 are arranged in accordance with the manner described in Embodiment 3.

The manufacturing method of the irregular-shaped display screen of area display in this embodiment comprises the following steps:

providing a TFT driving layer 102 upon a substrate 101; coating an organic photoresist layer upon the TFT driving layer 102; exposing and developing the organic photoresist layer within an area irregular-shaped display region, so as to form a pixel defining layer 103 having an open structure, while the photoresist layer within a non-display region 107 is not exposed, so that a non-open-structured pixel defining layer is formed, wherein the open-structured pixel defining layer has an arrangement structure that corresponds to a pixel arrangement structure within the area irregular-shaped display region; and depositing pixel display units 106 within the open-structured pixel defining layer 103 by using the vapor deposition mask. The full-etching open area 126 of the vapor deposition mask has a shape that fits the pixel arrangement structure of the area irregular-shaped display region.

Apparently, the aforementioned embodiments are merely examples illustrated for clearly describing the present invention, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. A pixel arrangement structure, used for an irregular-shaped display region of an irregular-shaped display screen wherein, the pixel arrangement structure is provided with several rows and/or several columns of pixel display units, wherein neighboring rows and/or neighboring columns of the pixel display units are arranged in parallel within an irregular-shaped display region;

the irregular-shaped display region comprises an oblique line display region, a line connecting two pixel display units farthest apart within the oblique line display region forms an intersection angle of $\theta$ with respect to the horizontal plane, the line connecting two pixel display units farthest apart within the oblique line display region has a length of L, each pixel display unit has a square shape with a side length of $L_0$, when $\theta$ is in the range of 45° to 60°, the oblique line display region is provided with $S_1$ pixel display units arranged in a horizontal direction and $S_2$ pixel display units arranged in a vertical direction:

$$S_1 = \left[2 \times \frac{60-\theta}{60-45} + 2 \times \frac{\theta-45}{60-45}\right] \times \left(\frac{L}{2}\right)^{\frac{1}{2}} \times L_0$$

$$S_2 = \left[3 \times \frac{60-\theta}{60-45} + 2 \times \frac{\theta-45}{60-45}\right] \times \left(\frac{L}{2}\right)^{\frac{1}{2}} \times L_0;$$

when $\theta$ is in the range of 60° to 90°, the oblique line display region is provided with $S_3$ pixel display units arranged in a horizontal direction and $S_4$ pixel display units arranged in a vertical direction:

$$S_3 = \left[2 \times \frac{90-\theta}{90-60} + 2 \times \frac{\theta-60}{90-60}\right] \times \left(\frac{L}{2}\right)^{\frac{1}{2}} \times L_0$$

$$S_4 = \left[3 \times \frac{90-\theta}{90-60} + 2 \times \frac{\theta-60}{90-60}\right] \times \left(\frac{L}{2}\right)^{\frac{1}{2}} \times L_0.$$

when $\theta$ is in the range of 0° to 30°, the oblique line display region has a pixel arrangement obtained by turning over the pixel arrangement of θ being in the range of 60° to 90° around a symmetry axis of 45°;

when θ is in the range of 30° to 45°, the oblique line display region has a pixel arrangement obtained by turning over the pixel arrangement of θ being in the range of 45° to 60° around a symmetry axis of 45°.

2. The pixel arrangement structure according to claim 1, wherein:

when θ=30°, the oblique line display region is provided with multiple rows of pixel display unit groups, wherein each pixel display unit group includes 3 pixel display units arranged side-by-side in a horizontal direction, pixel display units at two ends of each pixel display unit group are respectively aligned with a single pixel display unit in a neighboring pixel display unit group; an outermost row at one end of the display region is provided with one single pixel display unit; a line connecting two pixel display units farthest apart within the display region forms an angle of 30° with the horizontal plane;

when θ=45°, the oblique line display region is provided with multiple rows of pixel display unit groups, wherein each pixel display unit group includes 2 pixel display units arranged side-by-side in a horizontal direction, the 2 pixel display units in each pixel display unit group are respectively aligned with a pixel display unit in a neighboring pixel display unit group; a line connecting two pixel display units farthest apart within the display region forms an angle of 45° or 135° with the horizontal plane;

when θ=60°, the oblique line display region is provided with multiple columns of pixel display unit groups, wherein each pixel display unit group includes 3 pixel display units arranged side-by-side in a vertical direction, pixel display units at two ends of each pixel display unit group are respectively aligned with a single pixel display unit in a neighboring pixel display unit group; an outermost column at two ends of the display region is provided with one single pixel display unit; a line connecting two pixel display units farthest apart within the display region forms an angle of 60° or 120° with the horizontal plane;

$$S_1 = \left[2 \times \frac{60-\theta}{60-45} + 2 \times \frac{\theta-45}{60-45}\right] \times \left(\frac{L}{2}\right)^{\frac{1}{2}} \times L_0$$

$$S_2 = \left[3 \times \frac{60-\theta}{60-45} + 2 \times \frac{\theta-45}{60-45}\right] \times \left(\frac{L}{2}\right)^{\frac{1}{2}} \times L_0;$$

$$S_3 = \left[2 \times \frac{90-\theta}{90-60} + 2 \times \frac{\theta-60}{90-60}\right] \times \left(\frac{L}{2}\right)^{\frac{1}{2}} \times L_0$$

$$S_4 = \left[3 \times \frac{90-\theta}{90-60} + 2 \times \frac{\theta-60}{90-60}\right] \times \left(\frac{L}{2}\right)^{\frac{1}{2}} \times L_0.$$

3. The pixel arrangement structure according to claim 1, wherein, the irregularly-shaped display region further comprises a curved line display region, the curved line display region is decomposed into small oblique line segments having different angles, wherein each oblique line segment is provided with 2 to 3 pixel display units, several rows and/or several columns of pixel display units are provided within the oblique line segment, wherein neighboring rows and/or neighboring columns of the pixel display units are arranged in parallel, so as to cause a line connecting two pixel display units farthest apart within the oblique line segment to form an angle of θ with respect to the horizontal plane.

4. The pixel arrangement structure according to claim 1, wherein, the irregular-shaped display region further comprises an area display region is decomposed into oblique line display regions having different angles and a border line display region, each of the oblique line display regions is provided with several rows and/or several columns of pixel display units, wherein neighboring rows and/or neighboring columns of the pixel display units are arranged in parallel, so as to cause a line connecting two pixel display units farthest apart within the oblique line display region to form an angle, with the horizontal plane, equal to the intersection angle between the oblique line and the horizontal plane;

the border line display region is decomposed into small oblique line segment display regions having different angles, wherein each oblique line segment display region is provided with 2 to 3 pixel display units; several rows and/or several columns of pixel display units are provided within the oblique line segment display region, wherein neighboring rows and/or neighboring columns of the pixel display units are arranged in parallel, so as to cause a line connecting two pixel display units farthest apart within the oblique line segment display region to form an angle, with the horizontal plane, equal to the intersection angle between the oblique line segment and the horizontal plane.

5. The pixel arrangement structure according to claim 1, wherein, the pixel display units comprise one or more selected from a red light sub-pixel, a green light sub-pixel, a blue light sub-pixel.

6. An irregular-shaped display screen, comprising a substrate and a TFT driving layer provided upon the substrate, the substrate is divided into an irregular-shaped display region and a non-display region, a plurality of pixel defining layers are provided upon the TFT driving layer, the pixel defining layers form a continuous network structure, characterized in that, the pixel defining layer upon the irregular-shaped display region has an open structure, the pixel defining layer upon the non-display region has a non-open state, the irregular-shaped display region is provided with a plurality of pixel display units arranged in accordance with the pixel arrangement structure of claim 1.

7. The irregular-shaped display screen according to claim 6, wherein the plurality of pixel display units are arranged in several rows and/or several columns, wherein neighboring rows and/or neighboring columns of the pixel display units are arranged in parallel within an irregular-shaped display region.

* * * * *